(12) United States Patent
Chiang et al.

(10) Patent No.: US 8,723,194 B2
(45) Date of Patent: May 13, 2014

(54) ARRAY SUBSTRATE AND PIXEL UNIT OF DISPLAY PANEL

(71) Applicant: AU Optronics Corp., Hsin-Chu (TW)

(72) Inventors: Chia-Lun Chiang, Hsin-Chu (TW); Yu-Sheng Huang, Hsin-Chu (TW); Meng-Ju Tsai, Hsin-Chu (TW); Yan-Ciao Chen, Hsin-Chu (TW); Yi-Ching Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/691,857

(22) Filed: Dec. 3, 2012

(65) Prior Publication Data

US 2013/0256707 A1    Oct. 3, 2013

(30) Foreign Application Priority Data

Apr. 3, 2012    (TW) .............................. 101111824 A

(51) Int. Cl.
*H01L 33/08*    (2010.01)
(52) U.S. Cl.
USPC ........................ 257/88; 257/72; 257/E33.006

(58) Field of Classification Search
USPC ..................................................... 257/72, 88
See application file for complete search history.

(56) References Cited

U.S. PATENT DOCUMENTS

| | | | |
|---|---|---|---|
| 7,796,106 B2 | 9/2010 | Ha | |
| 8,081,147 B2 | 12/2011 | Lee | |
| 2008/0150862 A1 | 6/2008 | Tseng | |
| 2011/0181974 A1* | 7/2011 | Hori et al. | 359/891 |
| 2012/0092241 A1* | 4/2012 | Shang | 345/96 |
| 2012/0119237 A1* | 5/2012 | Leatherdale et al. | 257/88 |
| 2012/0249943 A1* | 10/2012 | Pai | 349/141 |
| 2013/0082271 A1* | 4/2013 | Kanegae | 257/72 |
| 2013/0106812 A1* | 5/2013 | Miura | 345/204 |
| 2013/0313559 A1* | 11/2013 | Yoon et al. | 257/59 |

* cited by examiner

*Primary Examiner* — Mamadou Diallo
(74) *Attorney, Agent, or Firm* — Winston Hsu; Scott Margo

(57) ABSTRACT

An array substrate and a pixel unit of a display panel include a plurality of subpixels arranged in a pixel array (N row*M column). Only one data line is disposed in a portion of two adjacent columns of subpixels in the pixel array, and two data lines are disposed in another portion of two adjacent columns of subpixels in the pixel array.

16 Claims, 5 Drawing Sheets

ARRAY SUBSTRATE AND PIXEL UNIT OF DISPLAY PANEL

BACKGROUND OF THE INVENTION

1. Field of the Invention

The present invention generally relates to an array substrate and a pixel unit of a display panel, and more particularly, to an array substrate and a pixel unit of a display panel with a relatively long charge time and a low color washout, which has an improved frame rate.

2. Description of the Prior Art

Flat display devices, such as liquid crystal display (LCD) devices, have many advantageous characteristics such as compact size, and thus they have replaced conventional cathode ray tube (CRT) devices and become mainstream products in the display market. However, conventional liquid crystal display devices are prone to have color washout issues and a conventional solution to this problem is to double the number of data lines of the liquid crystal display panel. But this solution raises other issues, such as increased manufacturing costs of source driver chips, reduced aperture ratio and insufficient charge time. Nowadays, in order to achieve high display quality, the resolution of liquid crystal display devices has to fulfill specific specifications, like Full HD (1920*1080) requirement. And for some specific liquid crystal display devices, such as 3D liquid crystal display devices or liquid crystal display devices for video games, frame rates have to achieve 120 Hz, or even 240 Hz. If the number of gate lines and data lines and the frame rate are increased, liquid crystal display devices will face problems like increased manufacturing costs of source driver chips, low aperture rate and insufficient charge time.

SUMMARY OF THE INVENTION

One purpose of the present invention is to provide an array substrate and a pixel unit of a display panel which may increase the pixel charge time and the frame rates, reduce the manufacturing costs of the source driver chips and overcome the color washout issue.

According to one preferred embodiment of the present invention, an array substrate of a display panel is provided, which includes a plurality of subpixels, a plurality of active devices, a plurality of first gate lines, a plurality of second gate lines, a plurality of first data lines, a plurality of second data lines, a plurality of third data lines and a fourth data line. The subpixels are arranged in a pixel array of N rows and M columns, wherein N and M are positive integers. The active devices are respectively disposed in each of the subpixels. A $p^{th}$ first gate line is disposed between the $(3n-2)^{th}$ row and the $(3n-1)^{th}$ row of the subpixels, and the $p^{th}$ first gate line is electrically connected to the active devices of the subpixels in the $(3n-2)^{th}$ row and to the active devices of a portion of the subpixels in the $(3n-1)^{th}$ row, wherein n is a set of positive integer less than or equal to N/3, and p is equal to n. The $p^{th}$ second gate line is disposed between the $(3n-1)^{th}$ row and the $3n^{th}$ row of the subpixels, and the $p^{th}$ second gate line is electrically connected to the active devices of a portion of the subpixels in the $(3n-1)^{th}$ row and to the active devices of the subpixels in the $3n^{th}$ row. A $q^{th}$ first data line is disposed on one side of the subpixels in the $(2m-1)^{th}$ column, wherein m is a set of positive integer less than or equal to M/2, and q is equal to m. When m=1, the $q^{th}$ first data line is electrically connected to the active devices of a portion of the subpixels in the $(2m-1)^{th}$ column. When $1<m\leq M/2$, the $q^{th}$ first data line is electrically connected to the active devices of a portion of the subpixels in the $(2m-2)^{th}$ column and a portion of the subpixels in the $(2m-1)^{th}$ column. The $q^{th}$ second data line is disposed between the $(2m-1)^{th}$ column and the $2m^{th}$ column of the subpixels, and the $q^{th}$ second data line is electrically connected to the active devices of a portion of the subpixels in the $(2m-1)^{th}$ column. The $q^{th}$ third data line is disposed between the $(2m-1)^{th}$ column and the $2m^{th}$ column of the subpixels, and the $q^{th}$ third data line is electrically connected to the active devices of a portion of the subpixels in the $2m^{th}$ column. The fourth data line is disposed on one side of the subpixels in the $M^{th}$ column, and the fourth data line is electrically connected to the active devices of a portion of the subpixels in the $M^{th}$ column.

According to another embodiment of the present invention, a pixel unit of a display panel is provided, which includes six subpixels arranged in an array of 3 rows and 2 columns, six active devices respectively located in the subpixels, a first gate line, a second gate line, a third data line, a first data line and a second data line. A first gate line is disposed between the first row and the second row of the subpixels, and the first gate line is electrically connected to the active devices of the subpixels in the first row and to the active device of one of the subpixels in the second row. The second gate line is disposed between the second row and the third row of the subpixels, and the second gate line is electrically connected to the active device of the other subpixel in the second row and to the active devices of the subpixels in the third row. The third data line is disposed on a side of the subpixels in the first column, and the third data line is electrically connected to the active devices of a portion of the subpixels of the first column. The first data line is disposed between the first column and the second column of the subpixels, and the first data line is electrically connected to the active devices of a portion of the subpixels in the first column and a portion of the subpixels in the second column. The second data line is disposed on one side of the subpixels in the second column, and the second data line is electrically connected to the active devices of a portion of the subpixels in the second column.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
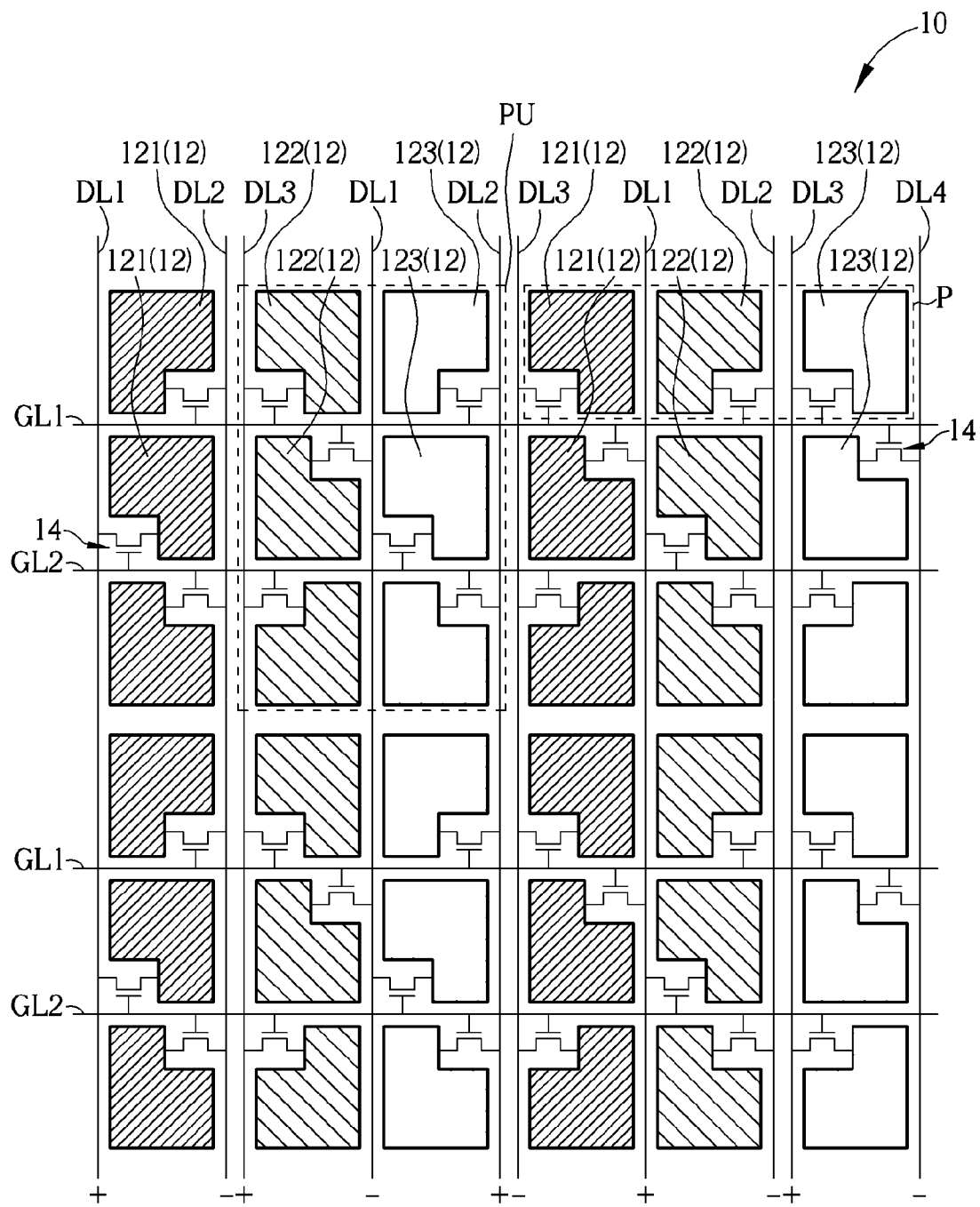
FIG. 1 is a schematic diagram showing an array substrate of a display panel according to a first preferred embodiment of the present invention.

Please refer to FIG. 1. FIG. 1 is a schematic diagram showing an array substrate of a display panel according to a first preferred embodiment of the present invention. As shown in FIG. 1, an array substrate 10 of a display panel disclosed in the present invention includes a plurality of subpixels 12, a plurality of active devices 14, a plurality of first gate lines GL1, a plurality of second gate lines GL2, a plurality of data lines (including a plurality of first data lines DL1, a plurality of second data lines DL2, a plurality of third data lines DL3 and a fourth data line DL4). The above-mentioned subpixels 12 are arranged in a pixel array of N rows and M columns, wherein N and M are positive integers. An array of 6 rows and 6 columns is shown in FIG. 1 as an example. The active devices 14, such as thin film transistor devices (TFT devices), are respectively disposed in the subpixels 12. A $p^{th}$ first gate line GL1 is disposed between the $(3n-2)^{th}$ row and the $(3n-1)^{th}$ row of the subpixels 12, and the $p^{th}$ first gate line GL1 is electrically connected to the active devices 14 of the subpixels 12 in the $(3n-2)^{th}$ row and to the active devices 14 of a portion of the subpixels 12 in the $(3n-1)^{th}$ row, wherein n is a set of positive integers less than or equal to N/3, and p is equal to n. The $p^{th}$ second gate line GL2 is disposed between the $(3n-1)^{th}$ row and the $3n^{th}$ row of the subpixels 12, and the $p^{th}$ second gate line GL2 is electrically connected to the active devices 14 of a portion of the subpixels 12 in the $(3n-1)^{th}$ row and to the active devices 14 of the subpixels 12 in the $3n^{th}$ row. For example, the 1st first gate line GL1 is disposed between the subpixels 12 in the first row and in the second row; the 2nd first gate line GL1 is disposed between the subpixels 12 in the fourth row and in the fifth row; the 1st second gate line GL2 is disposed between the subpixels 12 in the second row and in the third row; the 2nd second gate line GL2 is disposed between the subpixels 12 in the fifth row and in the sixth row, and so forth. In addition, the 1st first gate line GL1 is electrically connected to the active devices 14 of all the subpixels 12 in the first row and to the active devices 14 of a portion of the subpixel 12 in the second row; the 2nd first gate line GL1 is electrically connected to the active devices 14 of all the subpixels 12 in the fourth row and to the active devices 14 of a portion of the subpixel 12 in the fifth row, and so forth. The 1st second gate line GL2 is electrically connected to the active devices 14 of a portion of the subpixels 12 in the second row and to the active devices 14 of all the second subpixels 12 in the third row; the 2nd second gate line GL2 is electrically connected to the active devices 14 of a portion of the subpixels 12 in the fifth row and to the active devices 14 of all the second subpixel 12 in the sixth row, and so forth.

Furthermore, a $q^{th}$ first data line DL1 is disposed on one side (the left-hand side of FIG. 1) of the subpixels 12 in the $(2m-1)^{th}$ column, wherein m is a set of positive integers less than or equal to M/2, and q is equal to m. In one case, when m=1, the $q^{th}$ first data line DL1 is electrically connected to the active devices 14 of a portion of the subpixels 12 in the $(2m-1)^{th}$ column. In another case, when $1<m\leq M/2$, the $q^{th}$ first data line DL 1 is electrically connected to the active devices 14 of a portion of the subpixels 12 in the $(2m-2)^{th}$ column and a portion of the subpixels 12 in the $(2m-1)^{th}$ column. The $q^{th}$ second data line DL2 is disposed between the subpixels 12 in the $(2m-1)^{th}$ column and the subpixels 12 in the $2m^{th}$ column, and the $q^{th}$ second data line DL2 is electrically connected to the active devices 14 of a portion of the subpixels 12 in the $(2m-1)^{th}$ column. The $q^{th}$ third data line DL3 is disposed between the subpixels 12 in the $(2m-1)^{th}$ column and the subpixels 12 in the $2m^{th}$ column, and the $q^{th}$ third data line DL3 is electrically connected to the active devices 14 of a portion of the subpixels 12 in the $2m^{th}$ column. The fourth data line DL4 is disposed on one side (the right-hand side of FIG. 1) of the subpixels 12 in the $M^{th}$ column, and the fourth data line DL4 is electrically connected to the active devices 14 of a portion of the subpixels 12 in the $M^{th}$ column. For example, the 1st first data line DL1 is disposed on the left side of the subpixels 12 in the first column, the 1st second data line DL2 is disposed between the subpixels 12 in the first column and the subpixels 12 in the second column, the 1st third data line DL3 is disposed between the subpixels 12 in the first column and the subpixels in the second column. The 2nd first data line DL1 is disposed on the left side of the subpixels 12 in the third column, the 2nd second data line DL2 is disposed between the subpixels 12 in the third column and the subpixels 12 in the fourth column, the 2nd third data line DL3 is disposed between the subpixels 12 in the third column and the subpixels 12 in the fourth column, and so forth. The fourth data line DL4 is disposed on the right side of the subpixels 12 in the last column. Since the 1st first data line DL1 is only adjacent to the subpixels 12 in the first column, the 1st first data line DL1 is electrically connected to the active devices 14 of a portion of the subpixels 12 in the first column. Since the 2nd data line DL to the $q^{th}$ first data line DL1 are respectively disposed between two adjacent subpixels 12, the 2nd first data line DL1 is electrically connected to the active devices 14 of a portion of the subpixels 12 in the second column and to a portion of the subpixels 12 in the third column, and the 3rd first data line DL1 is respectively electrically connected to the active devices 14 of a portion of the subpixels 12 in the fourth column and to a portion of the subpixels 12 in the fifth column, and so forth. The 1st second data line DL2 is electrically connected to the active devices 14 of a portion of the subpixels 12 in the first column, the 2nd second data line DL2 is electrically connected to the active devices 14 of a portion of the subpixels 12 in the third column, and so forth. The 1st third data line DL3 is electrically connected to the active devices 14 of a portion of the subpixels 12 in the second column, the 2nd third data line DL3 is electrically connected to the active devices 14 of a portion of the subpixels 12 in the fourth column, and so forth. Since the fourth data line DL4 is only adjacent to the subpixels 12 in the last column, the fourth data line DL4 is electrically connected to the active devices 14 of a portion of the subpixels 12 in the last column.

As shown in FIG. 1, according to this embodiment, the $p^{th}$ first gate line GL1 is electrically connected to the active devices 14 of all the subpixels 12 in the $(3n-2)^{th}$ row and to the active devices 14 of the $2m^{th}$ subpixels 12 in the $(3n-1)^{th}$ row; and the $p^{th}$ second gate line GL2 is electrically connected to the active devices 14 of the $(2m-1)^{th}$ subpixels 12 in the $(3n-1)^{th}$ row and to the active devices 14 of all the subpixels in the $3n^{th}$ row. For example, the 1st first gate line GL1 is electrically connected to the active devices 14 of all the subpixels 12 in the first row and to the active device 14 of the subpixels 12 in even columns of the second row; the 2nd first gate line GL1 is electrically connected to the active devices 14 of all the subpixels 12 in the fourth row and to the active device 14 of the subpixels 12 in even columns of the fifth row, and so forth. The 1st second gate line GL2 is electrically connected to the active devices 14 of the subpixels 12 in odd columns of the second row and to the active devices 14 of all the subpixels 12 in the third row; the 2nd second gate line GL2 is electrically connected to the active devices 14 of the subpixels 12 in odd columns of the fifth row and to the active devices 14 of all the subpixels 12 in the sixth row, and so forth.

The 1st first data line DL1 is electrically connected to the active devices 14 of the second, the fifth, ..., and the $(3n-1)^{th}$ subpixels 12 in the first column. The 2nd first data line DL1 is electrically connected to the active devices 14 of the second, the fifth, ..., and the $(3n-1)^{th}$ subpixels 12 in the second column and to the active devices 14 of the second, the fifth, ..., and the $(3n-1)^{th}$ subpixels 12 in the third column; the 3rd first data line DL1 is electrically connected to the active devices 14 of the second, the fifth, ..., and the $(3n-1)^{th}$ subpixels 12 in the fourth column and to the active devices 14 of the second, the fifth, ..., and the $(3n-1)^{th}$ subpixels 12 in the fifth column, and so forth. The 1st second data line DL2 is electrically connected to the active devices 14 of the first, the fourth, ..., and the $(3n-2)^{th}$ subpixels 12 in the first column and to the active devices 14 of the third, the sixth, ..., and the $3n^{th}$ subpixels 12 in the first column; the 2nd second data line DL2 is electrically connected to the active devices 14 of the first, the fourth, ..., and the $(3n-2)^{th}$ subpixels 12 in the third column and to the active devices 14 of the third, the sixth, ..., and the $3n^{th}$ subpixels 12 in the third column, and so forth. The $1^{st}$ third data line DL3 is electrically connected to the active devices 14 of the first, the fourth, ..., and the $(3n-2)^{th}$ subpixels 12 in the second column and to the active devices 14 of the third, the sixth, ..., and the $3n^{th}$ subpixels 12 in the second column; the 2nd third data line DL3 is electrically connected to the active devices 14 of the first, the fourth, ..., and the $(3n-2)^{th}$ subpixels 12 in the fourth column and to the active devices 14 of the third, the sixth, ..., and the $3n^{th}$ subpixels 12 in the fourth column, and so forth. The fourth data line DL4 is electrically connected to the active devices 14 of the second, the fifth, ..., and the $(3n-1)^{th}$ subpixels 12 in the last column.

In this embodiment, each of the subpixels 12 in the $(3r-2)^{th}$ column is a first subpixel 121 used to display a first primary color image, each of the subpixels 12 in the $(3r-1)^{th}$ column is a second subpixel 122 used to display a second primary color image, each of the subpixels 12 in the $3r^{th}$ column is a third subpixel 123 used to display a third primary color image, wherein r is a set of positive integers less than or equal to M/3. That is to say, the subpixels 12 in the first, the fourth, the seventh, ..., and the $(3r-2)^{th}$ column are the first subpixels 121 used to display first primary color images; the subpixels 12 in the second, the fifth, the eighth, ..., and the $(3r-1)^{th}$ column are the second subpixels 122 used to display second primary color images; the subpixels 12 in the third, the sixth, the ninth, ..., and the $3r^{th}$ column are the third subpixels 123 used to display third primary color images. In this embodiment, the adjacent first subpixel 121, second subpixel 122, third subpixel 123 disposed in a same row constitute a pixel P (only a single pixel P is shown in FIG. 1). The first primary color image, the second primary color image and the third primary color image may respectively correspond to a red, a green and a blue image, but are not limited thereto.

The array substrate 10 of the display panel disclosed in the present invention may include a plurality of pixel units PU (only a single pixel unit PU is shown in FIG. 1). That is to say, according to the arrangement rule of the subpixels 12, a pixel array in the array substrate 10 of the display panel may be divided into a plurality of consecutively arranged pixel units PU. Each of the pixel units PU includes six subpixels 12, six active devices 14, a first gate line GL1, a second gate line GL2, a third data line DL3, a first data line DL1 and a second data line DL2. The above-mentioned six subpixels 12 are arranged in an array of 3 rows and 2 columns. Each of the active devices 14 is respectively disposed in each subpixel 12. The first gate line GL1 is disposed between the subpixels 12 in the first row and the subpixels 12 in the second row, and the first gate line GL1 is electrically connected to the active devices 14 of the subpixels 12 in the first row and to the active device 14 of one of the subpixels 12 in the second row. The second gate line GL2 is disposed between the subpixels 12 in the second row and the subpixels 12 in the third row, and the second gate line GL2 is electrically connected to the active device 14 of the other subpixel 14 in the second row and to the active devices 14 of the subpixels 12 in the third row. In this embodiment, the first gate line GL1 is electrically connected to the active devices 14 of all the subpixels 12 in the first row and to the active device 14 of the subpixel 12 disposed on the second position in the second row, and the second gate line GL2 is electrically connected to the active devices 14 of the subpixel 12 disposed on the first position in the second row and to the active devices 14 of all the subpixels 12 in the third row. The third data line DL3 is electrically connected to the active devices 14 of a portion of the subpixels 12 in the first column. The first data line DL1 is disposed between the subpixels 12 in the first column and the subpixels 12 in the second column, and the first data line DL1 is electrically connected to the active devices 14 of a portion of the subpixels 12 in the first column and a portion of the subpixels 12 in the second column. The second data line DL2 is disposed on one side (the right-hand side of FIG. 1) of the subpixels 12 in the second column, and the second data line DL2 is electrically connected to the active devices 14 of a portion of the subpixels 12 in the second column. In this embodiment, the third data line DL3 is electrically connected to the active devices 14 of the subpixel 12 disposed on the first position and a subpixel 12 disposed on the third position in the first column. The first data line DL1 is electrically connected to the active devices 14 of the subpixel 12 disposed on the second position in the first column and to the active devices 14 of the subpixel 12 disposed on the second position in the second column. The second data line DL2 is electrically connected to the active devices 14 of the subpixel 12 disposed on the first position and the subpixel 12 disposed on the third position in the second row.

Additionally, during the operation of the display panel, the data signals delivered to the second data line DL2 and the third data line DL3 have the same polarity, and the data signals delivered to the first data line DL1 and the second data line DL2 have opposite polarities. That is to say, the present invention may utilize a column inversion driving method to provide data signals to data lines so that each of the two adjacent data lines in the array substrate 10 of the display panel may have opposite polarities. As shown in FIG. 1, for example, during one frame time, the polarity in odd data lines is positive (as indicated by the symbol "+" shown in FIG. 1) and the polarity in even data lines is negative (as indicated by the symbol "−" shown in FIG. 1). During next frame time, the polarity of each data line will be inverted. That is to say that each odd data line will have a negative polarity and each even data line have a positive polarity. In the present invention, the pixel unit PU is a smallest unit of the subpixels 12 defined by the arrangement rule of the subpixels 12, while the pixel P includes subpixels which are used to display different primary color images (like red image, green image and blue image) during the operation time.

In comparison with a 1D1G pixel arrangement (one data line is disposed between two adjacent columns of subpixels, and one gate line is disposed between two adjacent rows of subpixels) under the same resolution, the number of gate lines of the display panel according to this embodiment is ⅔ of that of a 1D1G pixel arrangement. In this circumstance, each gate line is capable of charging subpixels in 1.5 rows, so that the charge rime may be increased by 1.5 times and may have a relatively high frame rate, such as a frame rate of 120 Hz or 240 Hz. Furthermore, in comparison with a display panel adopting a 2D1G pixel arrangement (two data lines are disposed between two adjacent columns of the subpixels, and one gate line is disposed between two adjacent rows of the subpixels), the embodiment discloses a specific pixel arrangement (only a first data line is disposed between a portion of two adjacent columns of pixels, and a second data line and a third data line are disposed between the other portion of two adjacent columns of pixels) so that the number of data lines used in the display panel is ¾ of that of a 2D1G pixel arrangement. In this way, the manufacturing costs of the source driver chips can therefore be reduced by ¼, and the display panel has a relatively high aperture ratio. In addition, according to an array substrate 10 of the display panel disclosed in the present invention, the data signals applied to each two adjacent data lines have opposite polarities; that is to say that the data signals are applied to the data lines through a column inversion driving method. Through the specific connection way where the gate lines are electrically connected to the active device 14 and the data lines are electrically connected to the active device 14, a display effect produced by the array substrate 10 of the display panel can be similar to a display effect produced by a dot inversion driving method.

The types of array substrates and the pixel units of the display panels are not limited to those described above. In the following paragraph, array substrates and pixel units of display panels according to other preferred embodiments or modified embodiments of the present invention are described. Similar features in various embodiments are usually described with same reference numerals for ease of illustration and description thereof. In addition, the description below is mainly focused on differences among each embodiment, and the similar parts are therefore omitted for the sake of clarity.

Figure 2:
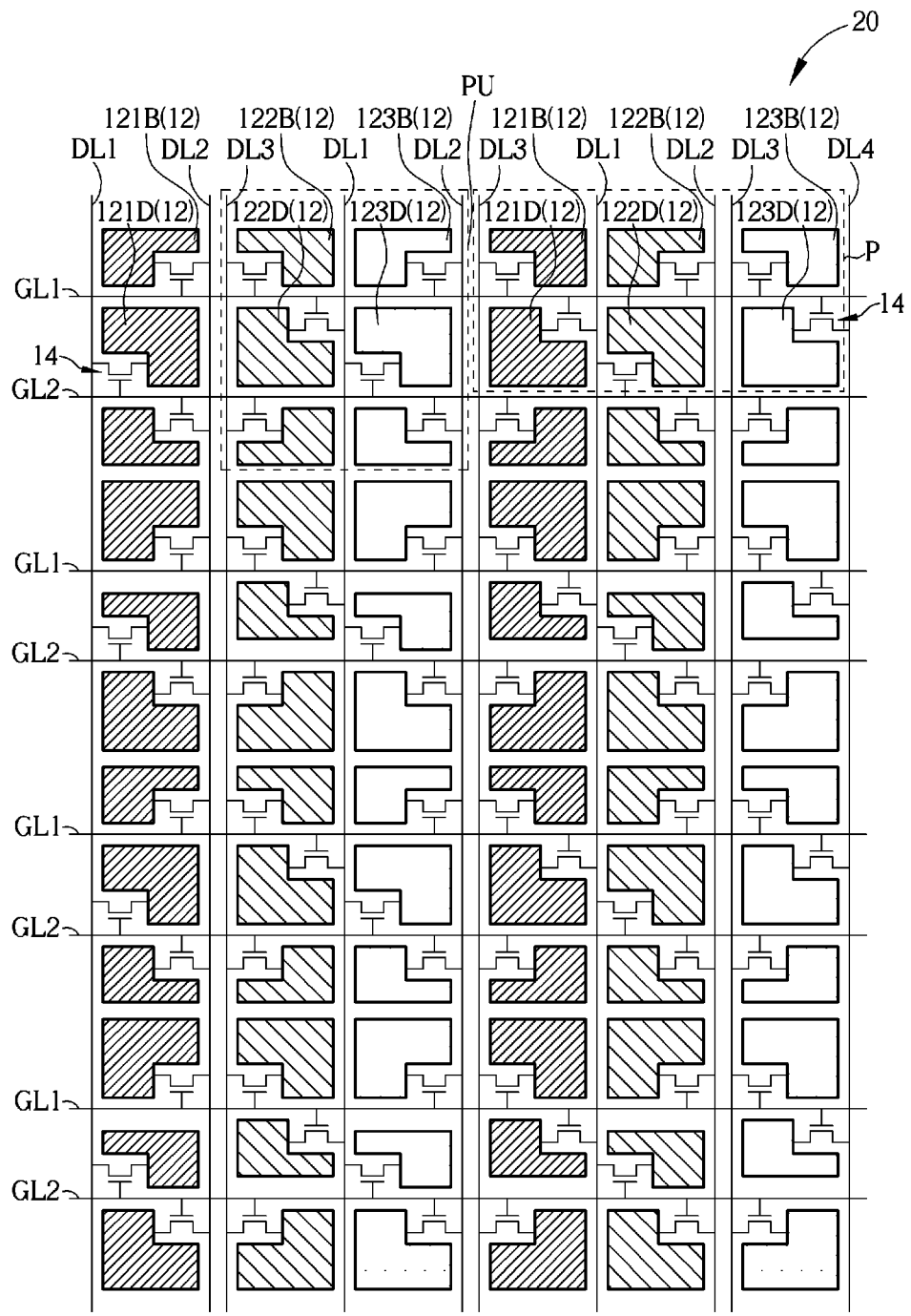
FIG. 2 is a schematic diagram showing an array substrate of a display panel according to a second preferred embodiment of the present invention.

Please refer to FIG. 2. FIG. 2 is a schematic diagram showing an array substrate of a display panel according to a second preferred embodiment of the present invention. According to this embodiment, the number and the arrangement of gate lines and data lines, the location of the active devices and their connection relations, and the elements of the pixel units are similar to those described in the first preferred embodiment. Differences between these embodiments are described in the following paragraph. In an array substrate 20 of a display panel according to this embodiment, the subpixel 12 in the $(3r-2)^{th}$ column and in the $(2s-1)^{th}$ row is a first bright subpixel 121B used to display a first primary color image, the subpixel 12 in the $(3r-2)^{th}$ column and in the $2s^{th}$ row is a first dark subpixel 121D used to display the first primary color image, the subpixel 12 in the $(3r-1)^{th}$ column and in the $(2s-1)^{th}$ row is a second bright subpixel 122B used to display a second primary color image, the subpixel 12 in the $(3r-1)^{th}$ column and in the $2s^{th}$ row is a second dark subpixel 122D used to display the second primary color image, the subpixel 12 in the $3r^{th}$ column and in the $(2s-1)^{th}$ row is a third bright subpixel 123B used to display a third primary color image, and the subpixel 12 in the $3r^{th}$ column and in the $2s^{th}$ row is a third dark subpixel 123D used to display the third primary color image, wherein r is a set of positive integers less than or equal to M/3 and s is a set of positive integers less than or equal to N/2. In this embodiment, the adjacent first bright subpixel 121B, second bright subpixel 122B and third bright subpixel 123B in the same row and the adjacent first dark subpixel 121D, second dark subpixel 122D and third dark subpixel 123D in another adjacent row constitute a pixel P. That is to say, the pixel P disclosed in this embodiment includes six subpixels 12. In a single pixel P, the first bright subpixel 121B and the first dark subpixel 121D are used to display the first primary color image, but the brightness of the first bright subpixel 121B is brighter than that of the first dark subpixel 121D; the second bright subpixel 122B and the second dark subpixel 122D are used to display the second primary color image, but the brightness of the second bright subpixel 122B is brighter than that of the second dark subpixel 122D; the third bright subpixel 123B and the third dark subpixel 123D are used to display the third primary color image, but the brightness of the third bright subpixel 123B is brighter than that of the third dark subpixel 123D. The first primary color image, the second primary color image and the third primary color image may be respectively corresponding to a red, a green and a blue image, but are not limited thereto. The arrangement of the pixel P in this embodiment can overcome the color washout of the display panel.

Figure 3:
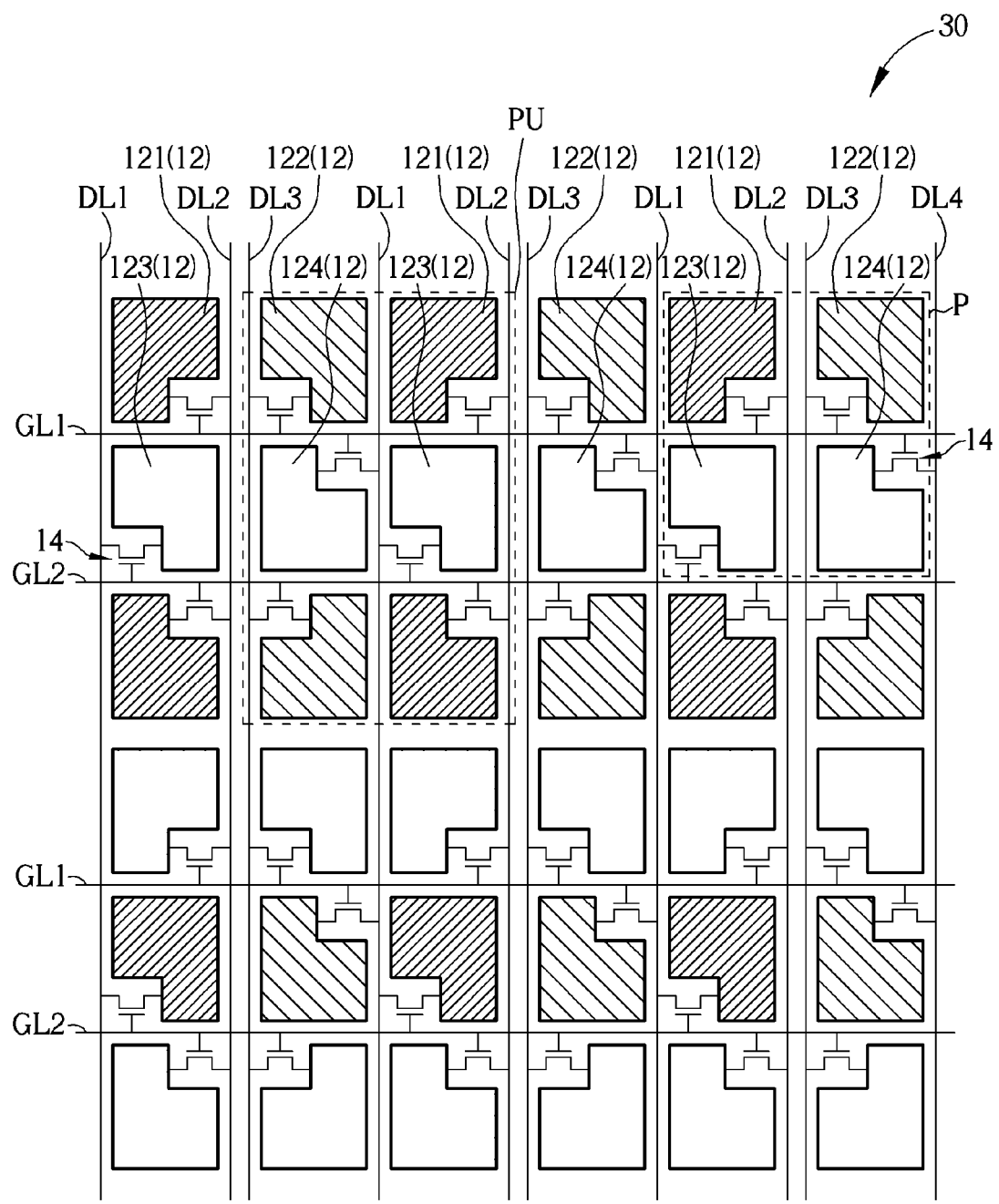
FIG. 3 is a schematic diagram showing an array substrate of a display panel according to a third preferred embodiment of the present invention.

Please refer to FIG. 3. FIG. 3 is a schematic diagram showing an array substrate of a display panel according to a third preferred embodiment of the present invention. Please refer to FIG. 3; according to this embodiment, the number and the arrangement of gate lines and data lines, the location of the active devices and their connection relations, and the elements of the pixel units are similar to those described in the first and the second preferred embodiments. Differences between these embodiments are described in the following paragraph. In an array substrate 30 of a display panel according to this embodiment, the subpixel 12 in the $(2m-1)^{th}$ column and in the $(2s-1)^{th}$ row is a first subpixel 121 used to display a first primary color image, and the subpixel 12 in the $2m^{th}$ column and in the $(2s-1)^{th}$ row is a second subpixel 122 used to display a second primary color image, the subpixel 12 in the $(2m-1)^{th}$ column and in the $2s^{th}$ row is a third subpixel 123 used to display the third primary color image, and the subpixel 12 in the $2m^{th}$ column and in the $2s^{th}$ row is a fourth subpixel 124 used to display a white image, wherein s is a set of positive integers less than or equal to N/2. In this embodiment, the adjacent first subpixel 121 and the second subpixel 122 in the same row and the adjacent third subpixel 123 and forth subpixel 124 in another adjacent row constitute a pixel P. That is to say that the pixel P disclosed in this embodiment includes 4 subpixels 12 arranged in an array of 2 rows and 2 columns. The first primary color image, the second primary color image and the third primary color image may respectively correspond to a red image, a green image and a blue image, but are not limited thereto. Since the pixel P can display the images including a red image, a green image, a blue image and a white image, the brightness and the contrast of the display panel can be improved.

Figure 4:
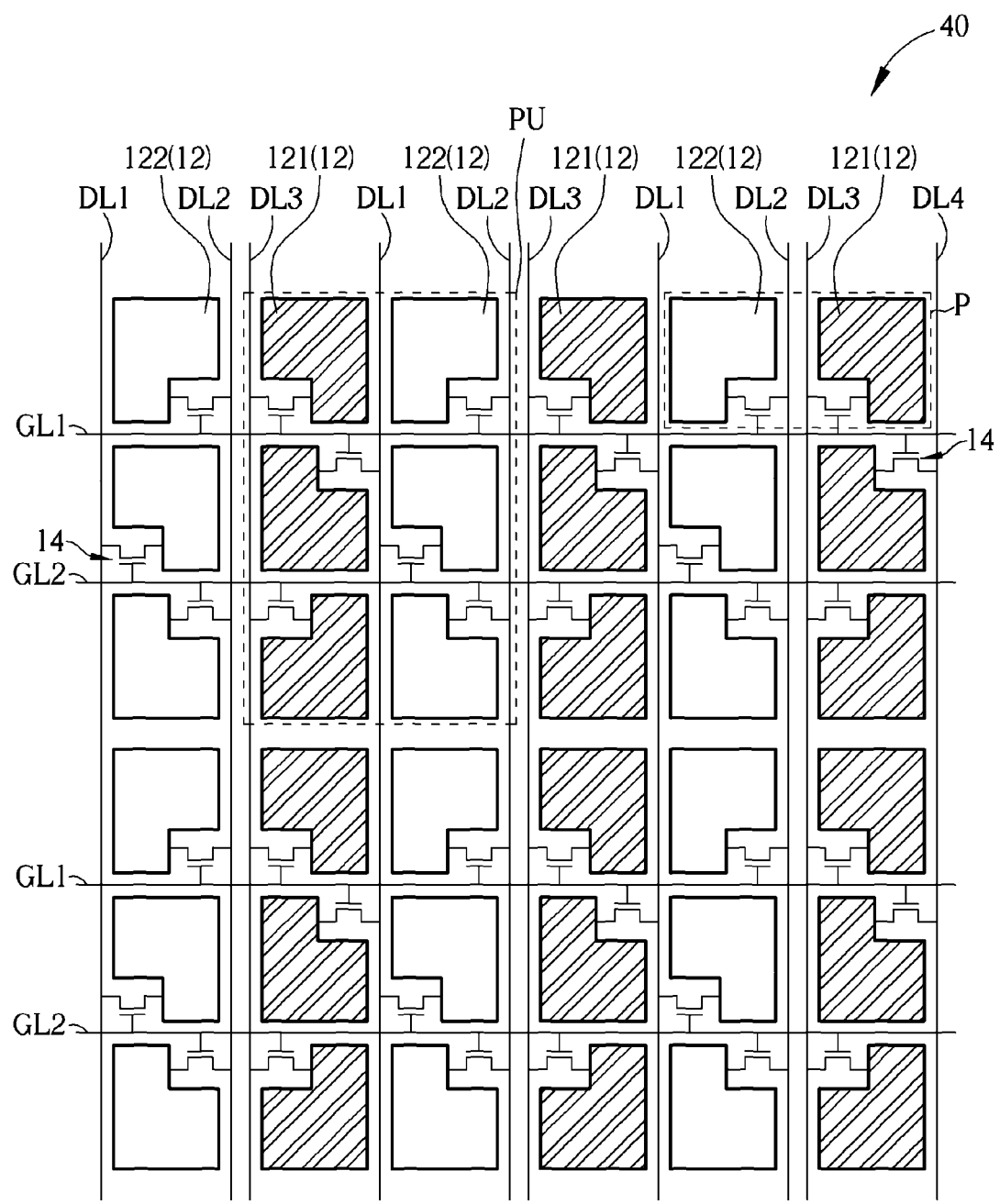
FIG. 4 is a schematic diagram showing an array substrate of a display panel according to a fourth preferred embodiment of the present invention.

Please refer to FIG. 4. FIG. 4 is a schematic diagram showing an array substrate of a display panel according to a fourth preferred embodiment of the present invention. According to this embodiment, the number and the arrangement of gate lines and data lines, the location of the active devices and their connection relations, and the elements of the pixel units are similar to those described in the first to the third preferred embodiments. Differences between these embodiments are described in the following paragraph. The array substrate 40 of the display panel disclosed in this embodiment is an array substrate of a field sequential color (FSC) display panel. The subpixel in the $2m^{th}$ column is a first subpixel 121 used to display a first primary color image, the subpixel 12 in the $(2m-1)^{th}$ column is a second subpixel 122 used to sequentially display a white image, a second primary color image and a third primary color image. The adjacent first subpixel 121 and second subpixel 122 located in the same row may constitute a pixel P. That is to say that the subpixels 12 in even columns are first subpixels 121 and the subpixels 12 in odd columns are second subpixels 122, and each two adjacent subpixels 12 constitute a pixel P. During the operation of the display panel, the frame time may be further divided into three sub frame times, wherein each second subpixel 122 may sequentially display a white image, a second primary color image and a third primary color image during the three sub frame time, while each first subpixel 121 may display a first primary color image during the first sub frame time and no image is displayed during the remaining two sub frame times. The first primary color image, the second primary color image and the third primary color image may be provided by a backlight module (not shown) that has several light emitting devices (such as LEDs) with different colors. Furthermore, the first subpixels 121 may be optionally equipped with color filters (not shown) and the second subpixels 122 may not be equipped with color filters, but are not limited thereto. The first primary color image may be a green image, and the second primary color image and third primary color image may be respectively corresponding to a red image and a blue image, but are not limited thereto. The phenomenon of color breakup (CBU) often occurs in conventional field sequential color display panels. Through the pixel arrangement provided by the present invention, the display panel may be used in a frame rate of 240 Hz, which may lower the sensation of the color breakup phenomenon to the human eyes. In addition, since each pixel P only includes two subpixels 12, the display panel may have relatively high resolution compared with conventional display panels in the same panel size.

Figure 5:
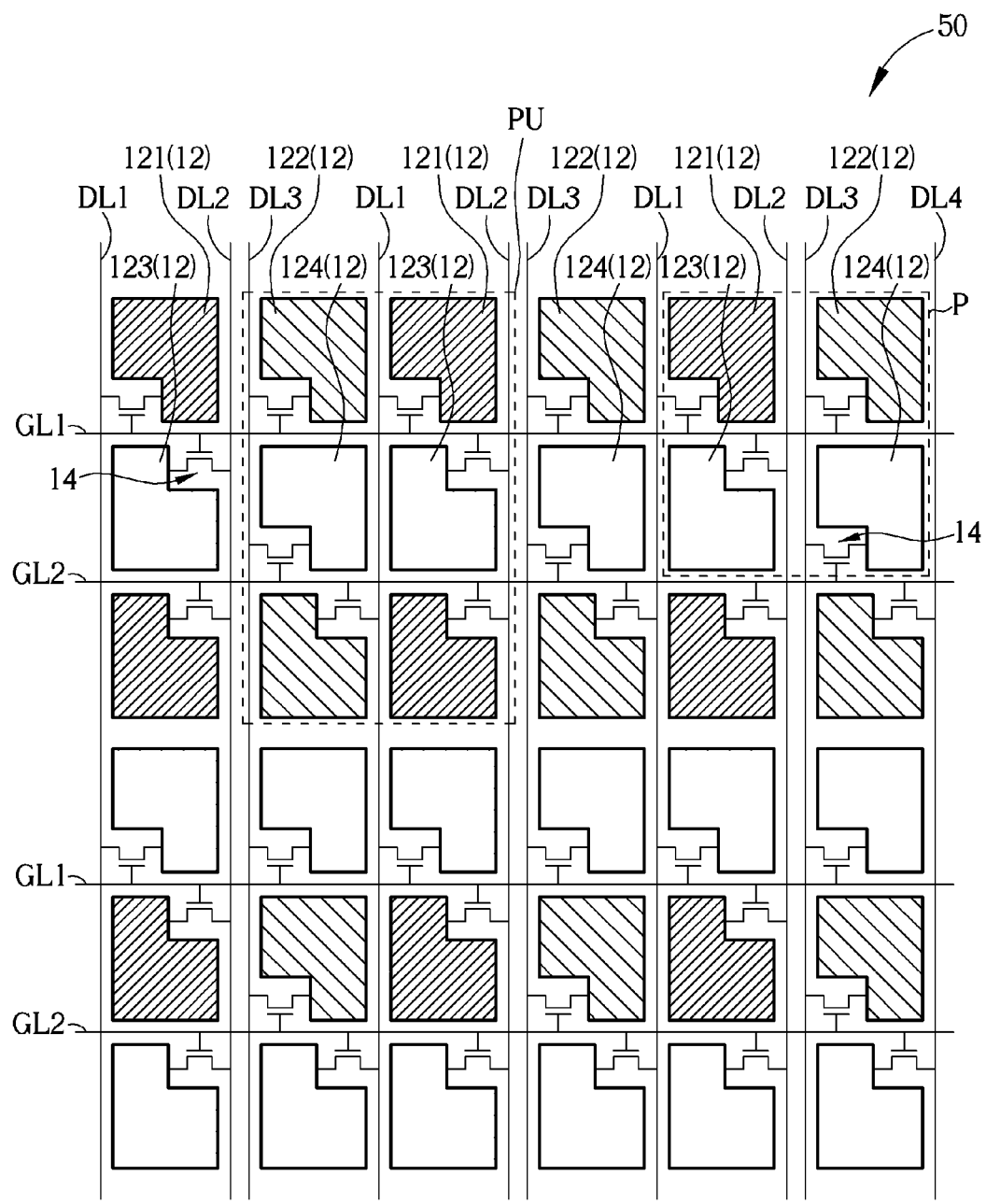
FIG. 5 is a schematic diagram showing an array substrate of a display panel according to a modified embodiment from the first preferred embodiment to the fourth preferred embodiment.

Please refer to FIG. 5. FIG. 5 is a schematic diagram showing an array substrate of a display panel according to a modified embodiment from the first preferred embodiment to the fourth preferred embodiment. According to this embodiment, the number and the arrangement of the gate lines and data lines, and the elements of the pixel units are almost the same as those described in the first and the second preferred embodiments. The differences between these embodiments are the location of the active devices and the electrical connection way between the active devices and the gate lines and data lines. According to an array substrate 50 of a display panel disclosed in this modified embodiment, the $p^{th}$ first gate line GL1 is electrically connected to the active devices 14 of all the subpixels 12 in the $(3n-2)^{th}$ row and to the active devices 14 of the $(2m-1)^{th}$ subpixels 12 in the $(3n-1)^{th}$ row. The $p^{th}$ second gate line GL2 is electrically connected to the active devices 14 of the $2m^{th}$ subpixels 12 in the $(3n-1)^{th}$ row and to the active devices 14 of all the subpixels 12 in the $3n^{th}$ row. When m=1, the $q^{th}$ first data line DL1 is electrically connected to the active devices 14 of the $(3n-2)^{th}$ subpixels 12 in the $(2m-1)^{th}$ column. When 1<m≤M/2, the $q^{th}$ first data line DL1 is electrically connected to the active devices 14 of the $3n^{th}$ subpixels 12 in the $(2m-2)^{th}$ column and the $(3n-2)^{th}$ subpixels 12 in the $(2m-1)^{th}$ column. The $q^{th}$ second data line DL2 is electrically connected to the active devices 14 of the $(3n-1)^{th}$ and the $3n^{th}$ subpixels 12 in the $(2m-1)^{th}$ column. The $q^{th}$ third data line DL3 is electrically connected to the active devices 14 of the $(3n-2)^{th}$ and the $(3n-1)^{th}$ subpixels 12 in the $2m^{th}$ column. The fourth data line DL4 is electrically connected to the active devices 14 of the $3n^{th}$ subpixels 12 in the $M^{th}$ column. For example, the 1st first gate line GL1 is electrically connected to the active devices 14 of all the subpixels 12 in the first row and to the active device 14 of the subpixels 12 in the odd columns of the second row, the 2nd first gate line GL1 is electrically connected to the active devices 14 of all the subpixels 12 in the fourth row and to the active device 14 of the subpixels 12 in the odd columns of the fifth row, and so forth. The 1st second gate line GL2 is electrically connected to the active devices 14 of the subpixels 12 in the even columns of the second row and to the active devices 14 of all the subpixels 12 in the third row; the 2nd second gate line GL2 is disposed between the fifth row and the sixth row of the subpixels 12, and the 2nd second gate line GL2 is electrically connected to the active devices 14 of the subpixels 12 in the even columns of the fifth row and to the active devices 14 of all the subpixels 12 in the sixth row, and so forth.

Furthermore, the $q^{th}$ first data line DL1 is disposed on one side (the left-hand side of FIG. 5) of the subpixels 12 in the $(2m-1)^{th}$ column. In one case, when m=1, the $q^{th}$ first data line DL1 is electrically connected to the active devices 14 of the $(3n-2)^{th}$ subpixels 12 in the $(2m-1)^{th}$ column; when 1<m≤M/2, the $q^{th}$ first data line DL1 is electrically connected to the active devices 14 of the $3n^{th}$ subpixels 12 in the $(2m-2)^{th}$ column and the $(3n-2)^{th}$ subpixels 12 in the $(2m-1)^{th}$ column. The $q^{th}$ second data line DL2 is disposed between the $(2m-1)^{th}$ column and the $2m^{th}$ column of the subpixels 12, and the $q^{th}$ second data line DL2 is electrically connected to the active devices 14 of the $(3n-1)^{th}$ and the $3n^{th}$ subpixels 12 in the $(2m-1)^{th}$ column. The $q^{th}$ third data line DL3 is disposed between the $(2m-1)^{th}$ column and the $2m^{th}$ column of the subpixels 12, and the $q^{th}$ third data line DL3 is electrically connected to the active devices 14 of the $(3n-2)^{th}$ and the $(3n-1)^{th}$ subpixels 12 in the $2m^{th}$ column. The fourth data line DL4 is electrically connected to the active devices 14 of the $3n^{th}$ subpixels 12 in the $M^{th}$ column. For example, the 1st first data line DL1 is electrically connected to the active devices 14 of the first, the fourth, . . . , and the $(3n-2)^{th}$ subpixels 12 in the first column; the 2nd first data line DL1 is electrically connected to the active devices 14 of the third, the sixth, . . . , and the $3n^{th}$ subpixels 12 in the second column and to the active devices 14 of the first, the fourth, . . . , and the $(3n-2)^{th}$ subpixels 12 in the third column; the 3rd first data line DL1 is electrically connected to the active devices 14 of the third, the sixth, . . . , and the $3n^{th}$ subpixels 12 in the fourth column and to the active devices 14 of the first, the fourth, . . . , and the $(3n-2)^{th}$ subpixels 12 in the fifth column, and so forth. The 1st second data line DL2 is electrically connected to the active devices 14 of the second, the fifth, . . . , and the $(3n-1)^{th}$ subpixels 12 and to the active devices 14 of the third, the sixth, . . . , and the $3n^{th}$ subpixels 12 in the first column; the 2nd second data line DL2 is electrically connected to the active devices 14 of the second, the fifth, . . . , and the $(3n-1)^{th}$ subpixels 12 and to the active devices 14 of the third, the sixth, . . . , and the $3n^{th}$ subpixels 12 in the third column, and so forth. The 1st third data line DL3 is electrically connected to the active devices 14 of the first, the fourth, . . . , and the $(3n-2)^{th}$ subpixels 12 and to the active devices 14 of the second, the fifth, . . . , and the $(3n-1)^{th}$ subpixels 12 in the second column; the 2nd third data line DL3 is electrically connected to the active devices 14 of the first, the fourth, . . . , and the $(3n-2)^{th}$ subpixels 12 and to the active devices 14 of the second, the fifth, . . . , and the $(3n-1)^{th}$ subpixels 12 in the fourth column, and so forth.

The array substrate 50 of the display panel disclosed in this embodiment may be a modified embodiment chosen from the first preferred embodiment to the fourth preferred embodiment. In this embodiment, the array substrate 50 of the display panel is a modified embodiment of the third preferred embodiment, and therefore each pixel P includes the adjacent first subpixel 121 and second subpixel 122 in the same row and the adjacent third subpixel 123 and fourth subpixel 124 in another adjacent row. When the array substrate 50 of the display panel is a modified embodiment of the first preferred embodiment, each pixel will include the adjacent first subpixel, second subpixel and the third subpixel in a same row; when the array substrate 50 of the display panel is a modified embodiment of the second preferred embodiment, each pixel will include the adjacent first bright subpixel, second bright subpixel and the third bright subpixel in the same row and the adjacent first dark subpixel, second dark subpixel and the third dark subpixel in another adjacent row; when the array substrate 50 of the display panel is a modified embodiment of the fourth preferred embodiment, each pixel will include the adjacent first subpixel and second subpixel in the same row.

To summarize, the present invention discloses array substrates and pixel unit of display panels, wherein each gate line is capable of charging subpixels in 1.5 rows so that the charge time may be increased by 1.5 times and may be applied in a frame rate of 240 Hz. Furthermore, the number of data lines used in the display panel according to the present invention is ¾ of that of a display panel adopting a 2D1G pixel arrangement, so that the manufacturing costs of the source driver chips can be therefore reduced by ¼. In addition, the display panel disclosed in the present invention utilizes a column inversion driving method to produce a display effect that is similar to a display effect produced by a dot inversion driving method so that the manufacturing costs of the source driver chips is further reduced effectively. The display panel disclosed in the present invention may be a liquid crystal panel or other types of suitable display panels.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An array substrate of a display panel, comprising:
a plurality of subpixels, wherein the subpixels are arranged in a pixel array of N rows and M columns, and the N and M are positive integers respectively;
a plurality of active devices disposed in the subpixels respectively;
a plurality of first gate lines, wherein a $p^{th}$ first gate line is disposed between the subpixels in a $(3n-2)^{th}$ row and the subpixels in a $(3n-1)^{th}$ row, n is a set of positive integers less than or equal to N/3, p is equal to n, and the $p^{th}$ first gate line is electrically connected to the active devices of the subpixels in the $(3n-2)^{th}$ row and the active devices of a portion of the subpixels in the $(3n-1)^{th}$ row;
a plurality of second gate lines, wherein a $p^{th}$ second gate line is disposed between the subpixels in the $(3n-1)^{th}$ row and the subpixels in a $3n^{th}$ row, and the $p^{th}$ second gate line is electrically connected to the active devices of a portion of the subpixels in the $(3n-1)^{th}$ row and the active devices of the subpixels in the $3n^{th}$ row; and
a plurality of data lines, comprising:
a plurality of first data lines, wherein a $q^{th}$ first data line is disposed on one side of the subpixels in a $(2m-1)^{th}$ column, m is a set of positive integers less than or equal to M/2, q is equal to m, and when m=1, the $q^{th}$ first data line is electrically connected to the active devices of a portion of the subpixels in the $(2m-1)^{th}$ column, and when $1<m\leq M/2$, the $q^{th}$ first data line is electrically connected to the active devices of a portion of the subpixels in a $(2m-2)^{th}$ column and a portion of the subpixels in the $(2m-1)^{th}$ column;
a plurality of second data lines, wherein a $q^{th}$ second data line is disposed between the subpixels in the $(2m-1)^{th}$ column and the subpixels in a $2m^{th}$ column, and the $q^{th}$ second data line is electrically connected to the active devices of a portion of the subpixels in the $(2m-1)^{th}$ column;
a plurality of third data lines, wherein a $q^{th}$ third data line is disposed between the subpixels in the $(2m-1)^{th}$ column and the subpixels in the $2m^{th}$ column, and the $q^{th}$ third data line is electrically connected to the active devices of a portion of the subpixels in the $2m^{th}$ column; and
a fourth data line disposed on one side of the subpixels in an $M^{th}$ column, wherein the fourth data line is electrically connected to the active devices of a portion of the subpixels in the $M^{th}$ column.

2. The array substrate of the display panel according to claim 1, wherein
the $p^{th}$ first gate line is electrically connected to the active devices of all the subpixels in the $(3n-2)^{th}$ row and to the active devices of the $2m^{th}$ subpixels in the $(3n-1)^{th}$ row; and
the $p^{th}$ second gate line is electrically connected to the active devices of the $(2m-1)^{th}$ subpixels in the $(3n-1)^{th}$ row and to the active devices of all the subpixels in the $3n^{th}$ row.

3. The array substrate of the display panel according to claim 1, wherein
the $p^{th}$ first gate line is electrically connected to the active devices of all the subpixels in the $(3n-2)^{th}$ row and to the active devices of the $(2m-1)^{th}$ subpixels in the $(3n-1)^{th}$ row; and
the $p^{th}$ second gate line is electrically connected to the active devices of the $2m^{th}$ subpixels in the $(3n-1)^{th}$ row and to the active devices of all the subpixels in the $3n^{th}$ row.

4. The array substrate of the display panel according to claim 1, wherein
when m=1, the $q^{th}$ first data line is electrically connected to the active devices of the $(3n-1)^{th}$ subpixels in the $(2m-1)^{th}$ column, and when $1<m\leq M/2$, the $q^{th}$ first data line is electrically connected to the active devices of the $(3n-1)^{th}$ subpixels in the $(2m-2)^{th}$ column and the active devices of the $(3n-1)^{th}$ subpixels in the $(2m-1)^{th}$ column;
the $q^{th}$ second data line is electrically connected to the active devices of the $(3n-2)^{th}$ subpixels and the $3n^{th}$ subpixels in the $(2m-1)^{th}$ column;
the $q^{th}$ third data line is electrically connected to the active devices of the $(3n-2)^{th}$ subpixels and the $3n^{th}$ subpixels in the $2m^{th}$ column; and
the fourth data line is electrically connected to the active devices of the $(3n-1)^{th}$ subpixels in the $M^{th}$ column.

5. The array substrate of the display panel according to claim 1, wherein
when m=1, the $q^{th}$ first data line is electrically connected to the active devices of the $(3n-2)^{th}$ subpixels in the $(2m-1)^{th}$ columns, and when $1<m\leq M/2$, the $q^{th}$ first data line is electrically connected to the active devices of the $3n^{th}$ subpixels in the $(2m-2)^{th}$ column and the active devices of the $(3n-2)^{th}$ subpixels in the $(2m-1)^{th}$ column;
the $q^{th}$ second data line is electrically connected to the active devices of the $(3n-1)^{th}$ subpixels and $3n^{th}$ subpixels in the $(2m-1)^{th}$ column;
the $q^{th}$ third data line is electrically connected to the active devices of the $(3n-2)^{th}$ subpixels and the $(3n-1)^{th}$ subpixels in the $2m^{th}$ column; and
the fourth data line is electrically connected to the active devices of the $3n^{th}$ subpixels in the $M^{th}$ columns.

6. The array substrate of the display panel according to claim 1, wherein each of the subpixels in a $(3r-2)^{th}$ column is a first subpixel used to display a first primary color image, each of the subpixels in a $(3r-1)^{th}$ column is a second subpixel used to display a second primary color image, each of the subpixels in a $3r^{th}$ column is a third subpixel used to display a third primary color image, and the adjacent first subpixel, second subpixel, third subpixel in a same row constitute a pixel, wherein r is a set of positive integers less than or equal to M/3.

7. The array substrate of the display panel according to claim 1, wherein each of the subpixels in a $(3r-2)^{th}$ column and in a $(2s-1)^{th}$ row is a first bright subpixel used to display a first primary color image, each of the subpixels in the $(3r-2)^{th}$ column and in a $2s^{th}$ row is a first dark subpixel used to display the first primary color image, each of the subpixels in a $(3r-1)^{th}$ column and in the $(2s-1)^{th}$ row is a second bright subpixel used to display a second primary color image, each of the subpixels in the $(3r-1)^{th}$ column and in the $2s^{th}$ row is a second dark subpixel used to display the second primary color image, each of the subpixels in a $3r^{th}$ column and in the $(2s-1)^{th}$ row is a third bright subpixel used to display a third primary color image, and each of the subpixels in the $3r^{th}$ column and in the $2s^{th}$ row is a third dark subpixel used to display the third primary color image, the adjacent first bright subpixel, second bright subpixel and third bright subpixel in a same row and the adjacent first dark subpixel, second dark subpixel and third dark subpixel in another adjacent row constitute a pixel, wherein r is a set of positive integers less than or equal to M/3 and s is a set of positive integers less than or equal to N/2.

8. The array substrate of the display panel according to claim 1, wherein each of the subpixels in the $(2m-1)^{th}$ column and in a $(2s-1)^{th}$ row is a first subpixel used to display a first primary color image, each of the subpixels in the $2m^{th}$ column and in the $(2s-1)^{th}$ row is a second subpixel used to display a second primary color image, each of the subpixels in the $(2m-1)^{th}$ column and in a $2s^{th}$ row is a third subpixel used to display a third primary color image, each of the subpixels in the $2m^{th}$ column and in the $2s^{th}$ row is a fourth subpixel used to display a white image, and the adjacent first subpixel and second subpixel located in a same row, and the adjacent third subpixel and fourth subpixel located in another adjacent row constitute a pixel, wherein s is a set of positive integers less than or equal to N/2.

9. The array substrate of the display panel according to claim 1, wherein each of the subpixels in the $2m^{th}$ column is a first subpixel used to display a first primary color image, each of the subpixels in the $(2m-1)^{th}$ column is a second subpixel used to sequentially display a white image, a second primary color image and a third primary color image, and the adjacent first subpixel and second subpixel located in a same row constitute a pixel.

10. The array substrate of the display panel according to claim 1, wherein data signals delivered to any two adjacent data lines have opposite polarities.

11. A pixel unit of a display panel, comprising:
six subpixels arranged in an array of 3 rows and 2 columns;
six active devices disposed in the subpixels respectively;
a first gate line disposed between the subpixels in a first row and in a second row, wherein the first gate line is electrically connected to the active devices of the subpixels in the first row and to the active device of one of the subpixels in the second row;
a second gate line disposed between the subpixels in the second row and in a third row, wherein the second gate line is electrically connected to the active device of the other one of the subpixels in the second row and to the active devices of the subpixels in the third row;
a third data line disposed on one side of the subpixels in a first column, wherein the third data line is electrically connected to the active devices of a portion of the subpixels in the first column;
a first data line disposed between the subpixels in the first column and in a second column, wherein the first data line is electrically connected to the active devices of a portion of the subpixels in the first column and a portion of the subpixels in the second column; and
a second data line disposed on one side of the subpixels in the second column, wherein the second data line is electrically connected to the active devices of a portion of the subpixels in the second column.

12. The pixel unit of the display panel according to claim 11, wherein
the first gate line is electrically connected to the active devices of all the subpixels in the first row and to the active device of the subpixel disposed on a second position in the second row; and
the second gate line is electrically connected to the active device of the subpixel disposed on a first position in the second row and to the active devices of all the subpixels in the third row.

13. The pixel unit of the display panel according to claim 11, wherein
the first gate line is electrically connected to the active devices of all the subpixels in the first row and to the active device of the subpixel disposed on a first position in the second row; and
the second gate line is respectively electrically connected to the active device of the subpixel disposed on a second position in the second row and the active devices of all the subpixels in the third row.

14. The pixel unit of the display panel according to claim 11, wherein
the third data line is electrically connected to the active devices of the subpixel disposed on a first position and the subpixel disposed on a third position in the first column;
the first data line is electrically connected to the active devices of the subpixel disposed on a second position in the first column and the subpixel disposed on a second position in the second column; and
the second data line is electrically connected to the active devices of the subpixel disposed on a first position and the subpixel disposed on a third position in the second column.

15. The pixel unit of the display panel according to claim 11, wherein
the third data line is electrically connected to the active devices of the subpixel disposed on a first position and the subpixel disposed on a second position in the first column;
the first data line is electrically connected to the active devices of the subpixel disposed on a third position in the first column and the subpixel disposed on a first position in the second column; and
the second data line is electrically connected to the active devices of the subpixel disposed on a second position and the subpixel disposed on a third position in the second column.

16. The pixel unit of the display panel according to claim 11, wherein data signals delivered to the second data line and the third data line have the same polarity, and data signals delivered to the first data line and the second data line have opposite polarities.

* * * * *